US012645927B2

(12) United States Patent
Rummens et al.

(10) Patent No.: US 12,645,927 B2
(45) Date of Patent: Jun. 2, 2026

(54) NON-VOLATILE MEMORIES WITH MIXED OxRAM/FeRAM TECHNOLOGIES

(71) Applicant: COMMISSARIAT A L'ENERGIE ATOMIQUE ET AUX ENERGIES ALTERNATIVES, Paris (FR)

(72) Inventors: François Rummens, Grenoble (FR);
Thomas Mesquida, Grenoble (FR);
Laurent Grenouillet, Grenoble (FR);
Alexandre Valentian, Grenoble (FR);
Elisa Vianello, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 849 days.

(21) Appl. No.: 18/075,347

(22) Filed: Dec. 5, 2022

(65) Prior Publication Data

US 2023/0186061 A1      Jun. 15, 2023

(30) Foreign Application Priority Data

Dec. 10, 2021    (FR) ...................................... 2113286

(51) Int. Cl.
| | |
|---|---|
| *G11C 11/22* | (2006.01) |
| *G06N 3/063* | (2023.01) |
| *G06N 3/08* | (2023.01) |
| *G11C 11/00* | (2006.01) |

(52) U.S. Cl.
CPC ............... *G06N 3/063* (2013.01); *G06N 3/08* (2013.01); *G11C 11/005* (2013.01)

(58) Field of Classification Search
CPC ......... G06N 3/063; G06N 3/08; G11C 11/005
See application file for complete search history.

(56) References Cited

U.S. PATENT DOCUMENTS

| | | | |
|---|---|---|---|
| 12,394,464 B2 * | 8/2025 | Martemucci | ........ G11C 11/2273 |
| 2020/0168264 A1 | 5/2020 | Endoh et al. | |
| 2021/0408021 A1 | 12/2021 | Young et al. | |

(Continued)

FOREIGN PATENT DOCUMENTS

| | | |
|---|---|---|
| CN | 113 540 099 A | 10/2021 |

OTHER PUBLICATIONS

Max, et al., "Interplay between ferroelectric and resistive switching in doped crystalline HfO2", J. Appl. Phys., vol. 123, 134102, 2018. (Year: 2018).*

(Continued)

*Primary Examiner* — Min Huang
(74) *Attorney, Agent, or Firm* — BakerHostetler

(57) ABSTRACT

A data storage circuit includes a matrix array of memory cells. The memory cells are configurable and non-volatile. Each one is intended to operate in either one of two operating configurations; the first operating configuration corresponding to a ferroelectric random-access memory; and the second operating configuration corresponding to a metal-oxide resistive random-access memory. Each memory cell comprises: a stack of thin layers in the following order: a first layer made of an electrically conductive material forming a lower electrode, a second layer made of a dielectric and ferroelectric material and a third layer made of electrically conductive material forming an upper electrode.

17 Claims, 12 Drawing Sheets

(56) References Cited

U.S. PATENT DOCUMENTS

| | | | |
|---|---|---|---|
| 2025/0374838 A1* | 12/2025 | Yang .................. | H10N 70/8825 |
| 2026/0020251 A1* | 1/2026 | Huang .................. | H10B 63/82 |

OTHER PUBLICATIONS

Covi, et al., "Ferroelectric Tunneling Junctions for Edge Computing", 2021 IEEE International Symposium on Circuits and Systems (ISCAS), 2021.
Max, et al., "Interplay between ferroelectric and resistive switching in doped crystalline HfO2", Journal of Applied Physics , vol. 123, Issue 13, 2018.

* cited by examiner

100

NVM

C3

C3  NVM  C2

NVM  C3  C2

C2

C1  C1  C1

SUB

NVM

C3(EL2)

Polarization-

Polarization+

NVM

C3(EL2)

C2

C2

C1(EL1)

C1(EL1)

Downward electrical polarization
(x=0)

Upward electrical polarization
(x=1)

EL1

C

EL2

EL1

C

EL2

CONF1

CONF2

Fig. 3

NON-VOLATILE MEMORIES WITH MIXED OxRAM/FeRAM TECHNOLOGIES

CROSS-REFERENCE TO RELATED APPLICATION

This application claims priority to foreign French patent application No. FR 2113286, filed on Dec. 10, 2021, the disclosure of which is incorporated by reference in its entirety.

FIELD OF THE INVENTION

The invention relates in general to non-volatile memory cells able to be configured to store data manipulated by computers in order to execute a computing algorithm. The computing algorithm that is executed requires a considerable number of write and/or read operations to and/or from the memory cells according to the invention.

In the field of embedded computers executing a computing algorithm involving an increasing number of numerical variables, electronic chips require a high memory capacity to store the computing variables. These computing algorithms may implement multiple computing phases: a first phase during which the manipulated variables undergo numerous modifications, and a second phase during which the same variables are fixed or undergo few modifications.

BACKGROUND

Various types of non-volatile memory may be used to implement the means for storing the computing variables of a computer circuit. However, the various non-volatile memory technologies exhibit different characteristics in terms of reliability and robustness faced with a considerable number of read and write operations to which they are subject. To qualify the robustness of the various memory technologies, the following characteristics are defined:

"Write cyclability" is understood to mean the maximum number of write cycles to which a memory cell is subject before structural failure thereof. This is then a criterion characterizing the technological robustness of the memory cells faced with an intense number of write operations.

"Read endurance" is understood to mean the maximum number of read cycles to which a memory cell is subject before structural failure thereof. This is then a criterion characterizing the technological robustness of the memory cells faced with an intense number of read operations.

"Read energy" is understood to mean the energy needed to read a bit from the memory cell; this is expressed in joules per bit. This is then a criterion characterizing the energy efficiency of the memory cells when performing a read operation.

"Write energy" is understood to mean the energy needed to write a bit to the memory cell; this is expressed in joules per bit. This is then a criterion characterizing the energy efficiency of the memory cells when performing a write operation.

The considerable increase in the number of read and write operations for implementing computing algorithms consumes a very large amount of energy for a system dedicated to a mobile application (telephony, autonomous vehicles, robotics, etc.). There is therefore a need for computers that make it possible to satisfy the constraints of embedded systems and targeted applications.

In this context, one technical problem to be solved is that of improving the energy efficiency and the technological robustness of the storage means for a computer circuit able to perform a first operating phase requiring a large number of write operations to the storage means and able to perform a second operating phase requiring a large number of read operations from said storage means.

The scientific publication entitled "Interplay between ferroelectric and resistive switching in doped crystalline HfO2" by Max et al describes a memory component compatible with metal-oxide resistive memory operation and ferroelectric memory operation. The publication is limited to describing the memory component, from a physical viewpoint, as an elementary component. The publication does not disclose specific implementation in a data storage circuit embedded in a computer circuit able to be configured in accordance with the specific properties of the computing phase that is performed in terms of a number of read and write operations.

In order to respond to the technical problem linked to improving the energy efficiency and the technological robustness of the storage means of a computer circuit intended to execute a computing algorithm on digital data, the invention proposes a data storage circuit comprising a matrix array of non-volatile memory cells able to be configured in two operating configurations. The first configuration corresponds to ferroelectric random-access memory (FeRAM) operation and the second configuration corresponds to resistive metal-oxide resistive random-access memory (OxRAM or ReRAM) operation. Indeed, on the one hand, ferroelectric random-access memory (FeRAM) technology exhibits high write endurance and low write energy, making it more suitable for performing an operation requiring multiple write iterations on stored data. On the other hand, metal-oxide resistive random-access memory (OxRAM or ReRAM) technology exhibits high read endurance and low read energy, making it more efficient for performing a computing operation requiring a considerable number of read operations on stored data.

The memory cells according to the invention are formed by the same stack of thin layers on one and the same semiconductor substrate for both operating configurations, allowing a dense implementation of the hybrid-technology memory cells in the same memory plane. This offers the advantage of reducing the surface area of the data storage circuit while still having operation able to be adapted in accordance with the phase executed by the computer in terms of prevalence of the number of read or write operations.

SUMMARY OF THE INVENTION

The invention furthermore proposes a control method for configuring the change from the first configuration to the second configuration of the memory cells so as to convert the data stored in the ferroelectric configuration to data stored in the resistive configuration.

Finally, we will describe the invention in the application context of an artificial neural network by way of illustration and without loss of generality. The features of the invention remain applicable to any computer for executing algorithms having two operating phases such that the first configuration requires a large number of write (or update) operations on stored data and such that the second configuration requires a large number of read operations on said data.

One subject of the invention is a data storage circuit comprising a matrix array of memory cells, of N rows and M columns, produced on a semiconductor substrate, comprising:

For each row, a first input node configured to receive a selection signal;

at least one second input node configured to receive a first write voltage;

For each column, an input/output node configured to receive a second write voltage and supply a read voltage;

the memory cells being configurable and non-volatile; each one being intended to operate in either one of two operating configurations;

the first operating configuration corresponding to a ferro-electric random-access memory;

and the second operating configuration corresponding to a metal-oxide resistive random-access memory;

each memory cell comprising:

a stack of thin layers in the following order: a first layer made of an electrically conductive material forming a lower electrode, a second layer made of a dielectric and ferroelectric material, a third layer made of electrically conductive material forming an upper electrode connected to the second input node associated with the column of said memory cell;

a selection transistor having a gate connected to the first input node associated with the row of said memory cell and connecting the lower electrode to the input/output node associated with the column of said memory cell.

The data storage circuit is configured, upon each transition from one operating configuration, called starting configuration, to the other operating configuration, called finishing configuration, to:

read each memory cell in the starting configuration and temporarily store a resulting read signal;

apply a transformation voltage to each memory cell;

convert each read signal in the starting configuration into a write signal compatible with the finishing configuration;

rewrite each memory cell based on the write signals compatible with the starting configuration.

According to one particular aspect of the invention, the data storage circuit furthermore comprises:

a write circuit for writing to each memory cell by supplying the first or the second write voltage based on a write control signal;

each of the write voltages being able to be adapted in accordance with the chosen operating configuration; the duration and/or the amplitude of said write voltage associated with the first operating configuration being lower than that associated with the second operating configuration;

a read circuit for supplying a read signal for each selected memory cell.

According to one particular aspect of the invention, the data storage circuit furthermore comprises:

at least one intermediate storage memory intended to temporarily store each read signal when the first configuration is chosen;

control means for controlling the read circuits and the write circuit in accordance with the chosen configuration and supplying the row selection signal.

According to one particular aspect of the invention, the control means comprise a conversion circuit configured to convert, for each memory cell, the read signal resulting from the first operating configuration into a write control signal compatible with the second operating configuration.

According to one particular aspect of the invention, the write circuit is configured to apply, to each second input node, a transformation voltage in order to form a conductive filament in the second layer starting from the third layer in each memory cell. Said filament corresponds to a low resistive state.

According to one particular aspect of the invention, the at least one intermediate storage memory is furthermore intended to store each read signal when the second configuration is chosen. The conversion circuit is configured to convert, for each memory cell, the read signal resulting from the second operating configuration into a write control signal compatible with the first operating configuration.

According to one particular aspect of the invention, the read circuit comprises a plurality of elementary read circuits each comprising:

a comparator for comparing the read voltage and a reference voltage in order to supply the read signal for the memory cell currently being read.

According to one particular aspect of the invention, the at least one intermediate storage memory is a synchronous flip-flop.

According to one particular aspect of the invention, the read circuit for each column is configured to perform a read operation by executing the following steps:

selecting the memory cell to be read by putting the selection transistor corresponding to said memory cell into the on state;

setting the input/output node associated with said column to a zero voltage;

applying a read pulse to the second input node associated with said column in order to charge the input/output node associated with the same column;

comparing the read voltage on the input/output node with the reference voltage.

According to one particular aspect of the invention, the read circuit and the at least one intermediate storage memory are formed by a single detection and storage circuit comprising:

a latch flip-flop having two input/output nodes;

a first input node being intended to receive the reference voltage and being connected to the first input/output node of the latch flip-flop via a first switch;

a second input node being intended to receive the read voltage and being connected to the second input/output node of the latch flip-flop via a second switch. The latch flip-flop is connected to a supply node via a first control transistor and to electrical earth via a second control transistor.

According to one particular aspect of the invention, the read circuit for each column is configured to perform a read operation by executing the following steps:

selecting the memory cell to be read by activating the selection transistor corresponding to said memory cell;

setting the input/output node associated with said column to a zero voltage;

putting the first and the second transistor into an on state and putting the first and the second control transistor into an off state in order to deactivate the latch flip-flop, applying a read pulse to the second input node associated with said column in order to charge the input/output node associated with the same column;

putting the first and the second switch into an on state in order to compare the read voltage on the input/output node with the reference voltage and supply the read signal;

putting the first and the second switch into an off state in order to temporarily store the read signal.

According to one particular aspect of the invention, the write circuit is configured to rewrite the data read from a memory cell after each read operation when the first configuration is chosen.

According to one particular aspect of the invention, the write circuit is configured to apply a write voltage having an amplitude and/or a duration sufficient to establish a conductive filament passing through an irreversible low resistive state.

According to one particular aspect of the invention, the first and the third layer are made of titanium nitride. The second layer is made of silicon-doped hafnium oxide or made of HfZrO2.

Another subject of the invention is a computer for executing a computing algorithm involving a plurality of numerical variables in at least two operating phases. The first operating phase essentially involves write operations on the numerical variable. The second operating phase essentially involves read operations on the numerical variable. Said computer comprises a data storage circuit according to the invention for storing the numerical variables and in which:

the memory cells are configured by the control means to operate in the first configuration during the execution of the first operating phase;

the memory cells are configured by the control means to operate in the second configuration during the execution of the second operating phase.

According to one particular aspect of the invention, the computer is configured to implement an artificial neural network, the neural network being formed of a succession of layers each consisting of a set of neurons, each layer being associated with a set of synaptic coefficients. The numerical variables are the synaptic coefficients of the neural network. The first operating phase is a learning phase. The second operating phase is an inference phase.

Another subject of the invention is a method for controlling a storage circuit according to the invention to drive the change from the first configuration to the second configuration. The method according to the invention comprises the following steps for each row of the matrix array of memories:

i. selecting the row of the matrix array of memory cells via the selection signal;

ii. reading each memory cell and storing each row read signal in the intermediate storage memories so as to detect the direction of the electrical polarization of each memory cell;

iii. applying, to each second input node of said row, a transformation voltage in order to form a conductive filament in the second layer starting from the third layer in each memory cell; said filament corresponding to a high resistive state, iv. converting the read signals stored in the intermediate storage memories during operation in the first configuration to write control signals compatible with the second configuration;

v. writing to the memory cells of said row in accordance with the write control signals compatible with the second configuration so as to vary the length of the conductive filament that is formed.

BRIEF DESCRIPTION OF THE DRAWINGS

Other features and advantages of the present invention will become more apparent on reading the following description in relation to the following appended drawings.

FIG. 3 illustrates a functional diagram of the architecture of a data storage circuit comprising the matrix array of memory cells according to the invention.

FIG. 6b illustrates a read and storage mechanism in the second operating configuration implemented by the combined circuit of FIG. 6a.

DETAILED DESCRIPTION

Figures 1A, 1B:
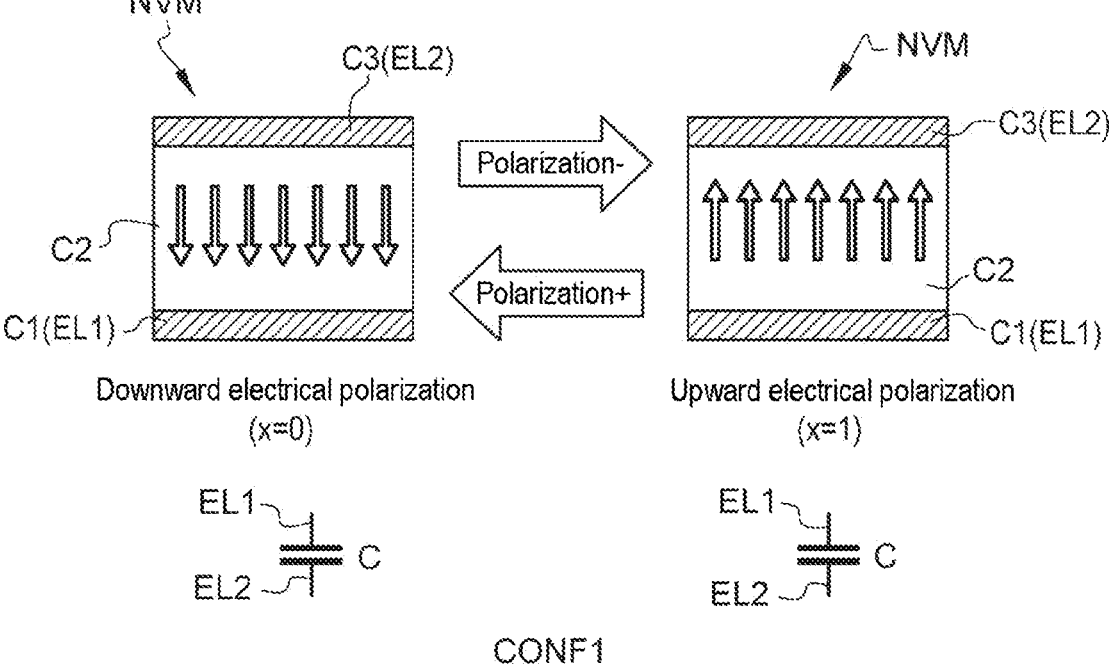
FIG. 1a illustrates a perspective view of one embodiment of a plurality of non-volatile and configurable memory structures according to the invention.
FIG. 1b illustrates a sectional view of a memory component according to the invention in the first operating configuration.

FIG. 1a illustrates a perspective view of one embodiment of a plurality of non-volatile and configurable memory structures NVM according to the invention. The memory structures NVM are formed by a stack of thin layers on one and the same semiconductor substrate SUB. The stack of thin layers is formed using the conventional microfabrication methods comprising depositing thin layers, etching, lithography and doping. In the context of the invention, all of the memory structures NVM are arranged in a matrix array 100. To simplify the illustration, we will show only one row of three memory structures NVM in FIG. 1a. In addition, a layer of dielectric material (not shown here for simplification) may separate the memory structures from the substrate SUB. Said layer is made of silicon dioxide $SiO_2$, for example. In the example illustrated, the memory structures NVM are etched such that they are separated by an empty space. As an alternative, it is conceivable to separate the memory structures using layers of electrically insulating material instead of empty spaces.

Each memory structure NVM according to the invention consists of the stack of thin layers in the following order: a first layer C1 made of an electrically conductive material forming a lower electrode EL1; a second layer C2 made of a dielectric and ferroelectric material and a third layer C3 made of electrically conductive material forming an upper electrode EL2. The characteristics of the materials forming the memory structure NVM layers allow said structure to be compatible with two memory technology operating configurations: the first operating configuration CONF1 corresponding to a ferroelectric random-access memory; and the second operating configuration CONF2 corresponding to a metal-oxide resistive random-access memory. The second layer C2 will be called the "central layer" in the remainder of the description.

By way of example and without loss of generality, the first layer C1 (and therefore the lower electrode EL1) and the third layer C3 (and therefore the upper electrode EL2) are made of titanium nitride TiN. The choice of titanium nitride TiN makes it possible to avoid the formation of an oxide layer on the two interfaces with the central layer C2 confined between the two electrodes. The thickness of each of the layers C1 (EL1) and C3 (EL2) is of the order of a few tens of nanometres, more particularly equal to 100 nm.

By way of example and without loss of generality, the central layer C2 is made of silicon-doped hafnium oxide, a dielectric material also exhibiting ferroelectric behaviour thus making it possible to produce the configurable non-volatile memory component according to the invention. The doping of the hafnium oxide is configured so as to obtain a crystalline structure having a mole fraction of silicon between 0.5% and 5%. The thickness of the central layer C2 is of the order of a few nanometres, more particularly equal to 10 nm.

As an alternative, the central layer C2 is made of an $Hf_{0.5}Zr_{0.5}O_2$ alloy formed of hafnium oxide and zirconium oxide, itself also exhibiting ferroelectric and dielectric behaviour that makes it possible to produce the configurable non-volatile memory component according to the invention.

As an alternative, the central layer C2 consists of a heterostructure formed with ferroelectric and dielectric materials.

We will now use FIGS. 1a and 1b to present the behaviour of the memory component NVM in the chosen operating configuration. FIG. 1b illustrates a sectional view of the memory component NVM in the first operating configuration CONF1 corresponding to ferroelectric random-access memory (FeRAM) operation. The stack of thin layers forms a MIM (acronym for metal-insulator-metal) structure acting as a capacitive element with a capacitance C. The ferroelectric nature of the central layer C2 brings about the following behaviour. When a positive voltage is applied to the upper electrode EL2, the polarization of the electric dipoles of the central layer is directed in what is called a "negative" direction. Conversely, when a positive voltage is applied to the lower electrode EL1, the polarization of the electric dipoles is directed in what is called a "positive" direction. The direction of the electrical polarization in the central layer C2 corresponds to a state of equilibrium that is maintained even in the absence of the electric field brought about by the voltage applied to either of the electrodes EL1 and EL2, hence ferroelectric memory operation.

The following convention is thus chosen by way of example: when a memory component NVM is configured to store a binary datum in the low logic state (x=0), a write voltage is temporarily applied to the upper electrode EL2 (illustrated by polarization +) so as to obtain a polarization directed in a "negative" direction in the central layer C2. Conversely, when a memory component NVM is configured to store a binary datum in the high logic state (x=1), a write voltage is temporarily applied to the lower electrode EL1 (illustrated by polarization −) so as to obtain a polarization directed in a "positive" direction in the central layer C2.

The read operation in the first operating configuration CONF1 is a destructive operation. Specifically, during a read access operation, the memory component NVM configured in the first operating configuration CONF1 receives a read voltage on the upper electrode so as to rewrite it in a low logic state (x=0). The dynamics of the transition following the application of the read voltage are then observed. If the electric dipoles of the central layer are polarized beforehand with an orientation in a "positive" direction (x=1), a relatively large amount of electric charge will be emitted by the device during the transition. Conversely, if the electric dipoles of the central layer are polarized beforehand with an orientation in a "negative" direction (x=0), the amount of charge delivered during the transition is lower. This means that the read procedure consists in estimating the amount of charge emitted during polarization in a low logic state (x=0) and that it therefore erases the logic value of the stored datum. This dual-state polarization operation corresponds to the operation of a capacitive element.

As an alternative, it is possible to perform a read operation in the first operating configuration CONF1 by applying a read voltage to the lower electrode so as to rewrite it in a high logic state (x=1) and by observing the dynamics of the transition following the application of the read voltage. If the transition requires a relatively large amount of electric charge, then the previous state of the memory cell is a low logic state (x=0). Otherwise, the previous state of the memory cell is a high logic state (x=1).

Figure 1C:
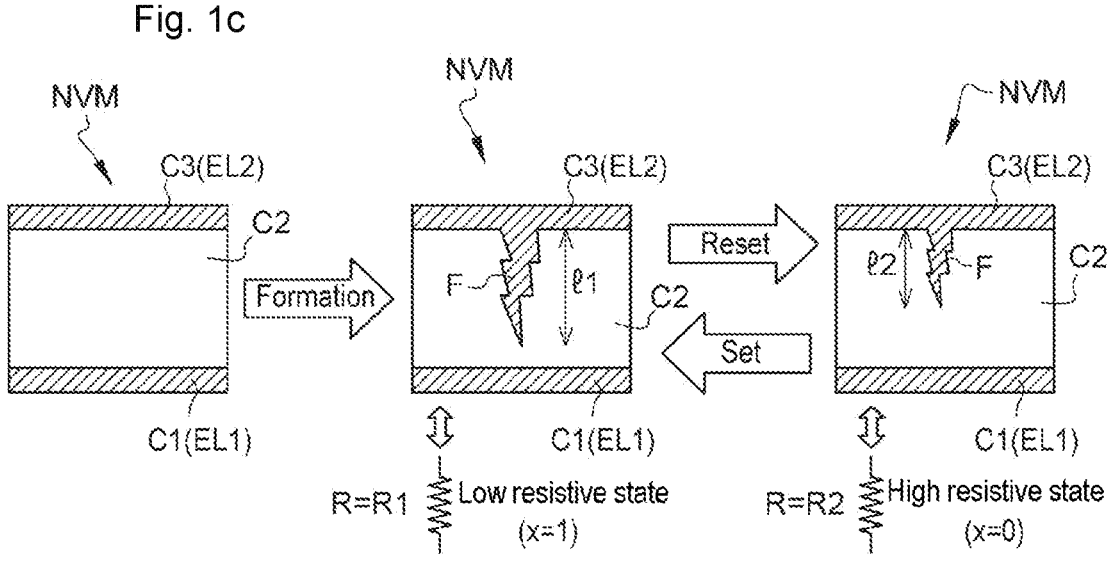
FIG. 1c illustrates a sectional view of the memory component according to the invention in the second operating configuration.

FIG. 1c illustrates a sectional view of the memory component NVM in the second operating configuration CONF2 corresponding to metal-oxide resistive random-access memory (ReRAM or OxRAM) operation. Operation in the second configuration CONF2 requires the formation of a conductive filament F through at least part of the central layer C2, which is electrically insulating.

Initially, the memory component NVM is a MIM (metal-insulator-metal) structure having infinite resistance between the two electrodes EL1 and EL2. In order to configure the memory component NVM in the second resistive memory operating configuration CONF2, it is necessary to form the filament F starting from the upper electrode EL2 through at least part of the volume of the central layer C2. The formation of the filament makes it possible to obtain a variable resistance by modulating the length I of the conductive filament that is formed. To form the filament, a formation voltage is applied to the upper electrode EL2. The formation voltage has an amplitude and/or a duration great enough to bring about the generation of oxygen gaps in the central layer C2. Specifically, the formation voltage that is applied has to exceed a predetermined value so as to tear oxygen ions away from the crystal lattice of the central metal oxide layer, which will merge towards the upper electrode EL2 and thus form a conductive filament F through the central layer consisting of oxygen gaps.

Once the conductive filament F has been formed, this gives the behaviour of a resistive element with a variable resistance R depending on the length I of the conductive filament F. When a positive voltage is applied to the lower electrode EL1, the reverse reaction takes place and oxygen ions will fill some of the oxygen gaps forming the conductive filament. This results in a reduction in the length of the conductive filament. The resistance of the resistive element thus increases. Reference is made to a high resistive state and a RESET write operation. Conversely, when a positive voltage is applied to the upper electrode EL2, the length of the conductive filament F increases through the same mechanism described for the operation of forming the wire. The resistance of the resistive element thus decreases. Reference is made to a low resistive state and a SET write operation.

The following convention is chosen by way of example: when a memory component NVM is configured to store a binary datum in the high logic state (x=1), a write voltage is temporarily applied to the upper electrode EL2 (SET operation) so as to obtain a low resistive state. Conversely, when a memory component NVM is configured to store a binary datum in the low logic state (x=0), a write voltage is temporarily applied to the lower electrode EL1 (RESET operation) so as to obtain a high resistive state.

Reading a memory component NVM during operation in the second configuration CONF2 consists in estimating the resistance between the upper electrode and the lower electrode and comparing it to a threshold value in order to determine whether the resistive state is a high or low state.

Below, we will compare the orders of magnitude of the various voltages applied to the electrodes of a memory component NVM according to the invention. The applied voltage is defined by an amplitude of this voltage and a duration of application of this voltage. The voltage applied when forming the filament has an application duration and/or an amplitude that is greatest out of the various abovementioned voltages, since it requires oxygen atoms to be torn away from the crystal lattice of the central layer C2. The write voltage compatible with the second configuration CONF2 (in a SET or RESET operation) has an application duration and/or an amplitude lower than those used to form the filament, since the filament that is formed beforehand is partially acted upon. The write voltage compatible with the first configuration CONF1 exhibits energy consumption lower than that of the write voltage compatible with the second configuration, since it involves modifying ferroelectric characteristics (electrons are acted upon) and not a structural modification on the atomic scale. By way of non-limiting example, we opt for write voltages and formation voltages in the form of square-wave pulses defined by an amplitude and an application duration. The filament formation voltage typically has an amplitude between 3 V and 4 V for a duration of 5 μs to 25 μs. The write voltage compatible with the second configuration CONF2 has an amplitude between 1.7 V and 2.5 V for a duration of 100 ns. The write voltage compatible with the first configuration CONF1 typically has an amplitude of 2 V to 5 V for a duration of 5 ns to 100 ns.

During writing, the strength of the current flowing through the memory structure NVM configured in the first configuration CONF1 (capacitive behaviour) is lower than the strength of the current flowing through the memory structure NVM configured in the second configuration CONF2 (resistive behaviour).

More generally, the two configurations CONF1 and CONF2 exhibit complementary characteristics in terms of technological robustness of the memory component and energy consumption faced with a considerable number of write or read operations:

From a "write energy" point of view, the write operation in the second operating configuration CONF2 is based on a structural physical modification of the central layer C2 involving high current strengths, typically of the order of 100 μA. The second operating configuration CONF2 thus requires, in each write operation, a high energy required for this structural modification of the material (around 100 pJ/bit). On the other hand, the write operations in the first operating configuration CONF1 consist more simply in applying a voltage across the terminals of the central layer C2 (around 10 fJ/bit). In this case, the write operation involves lower current strengths. The first operating configuration CONF1 thus consumes less write energy than the second operating configuration CONF2, with a write energy saving ratio per bit of up to 10 000.

From a "write cyclability" point of view, repeating the write operations in the second operating configuration CONF2 causes repetitive modifications of the internal structure of the central layer C2, thereby leading to gradual material wear of the memory structures NVM. The number of write cycles before the failure of a memory component operating only in the second configuration CONF2 is evaluated, and is estimated at a value between $10^5$ cycles and $10^6$ cycles. For the first operating configuration CONF1, the wear mechanism is linked to charge injection mechanisms. The number of write cycles before the failure of a memory component operating only in the first configuration CONF1 is estimated at $10^{12}$ cycles.

From a "read energy" and "read endurance" point of view, in a memory component NVM in the second configuration CONF2, the datum is stored in the resistive state of the device. The read operation therefore consists in simply evaluating this electrical variable without modifying the physical state of the component. The read operation thus does not degrade the stored datum or the material structure of the memory component, which, in this operating configuration, has a virtually infinite read endurance in the application context of a computer. Moreover, it has been demonstrated that the read operation is destructive for the content stored in the memory component NVM operating in the first configuration CONF1. The read process consists in draining the amount of charge flowing through the dielectric during a switching operation. This results in the need for a rewrite operation following the reading of a stored datum. The write endurance, which is not infinite, is thus carried over to the read endurance, given that each read operation involves a rewrite operation.

It is then concluded that, on the one hand, the first operating configuration CONF1 of the memory component NVM is more suited to a computing phase having a considerable number of operations of writing to the memories. On the other hand, the second operating configuration CONF2 of the memory component NVM is more suited to a computing phase having a considerable number of operations of reading the memories.

Below, we will describe the implementation and the involvement of the configurable memory component NVM in a data storage circuit 10 that may be implemented in a computer circuit configured to execute a computing algorithm involving a plurality of numerical variables in at least two computing phases.

Figure 2A:
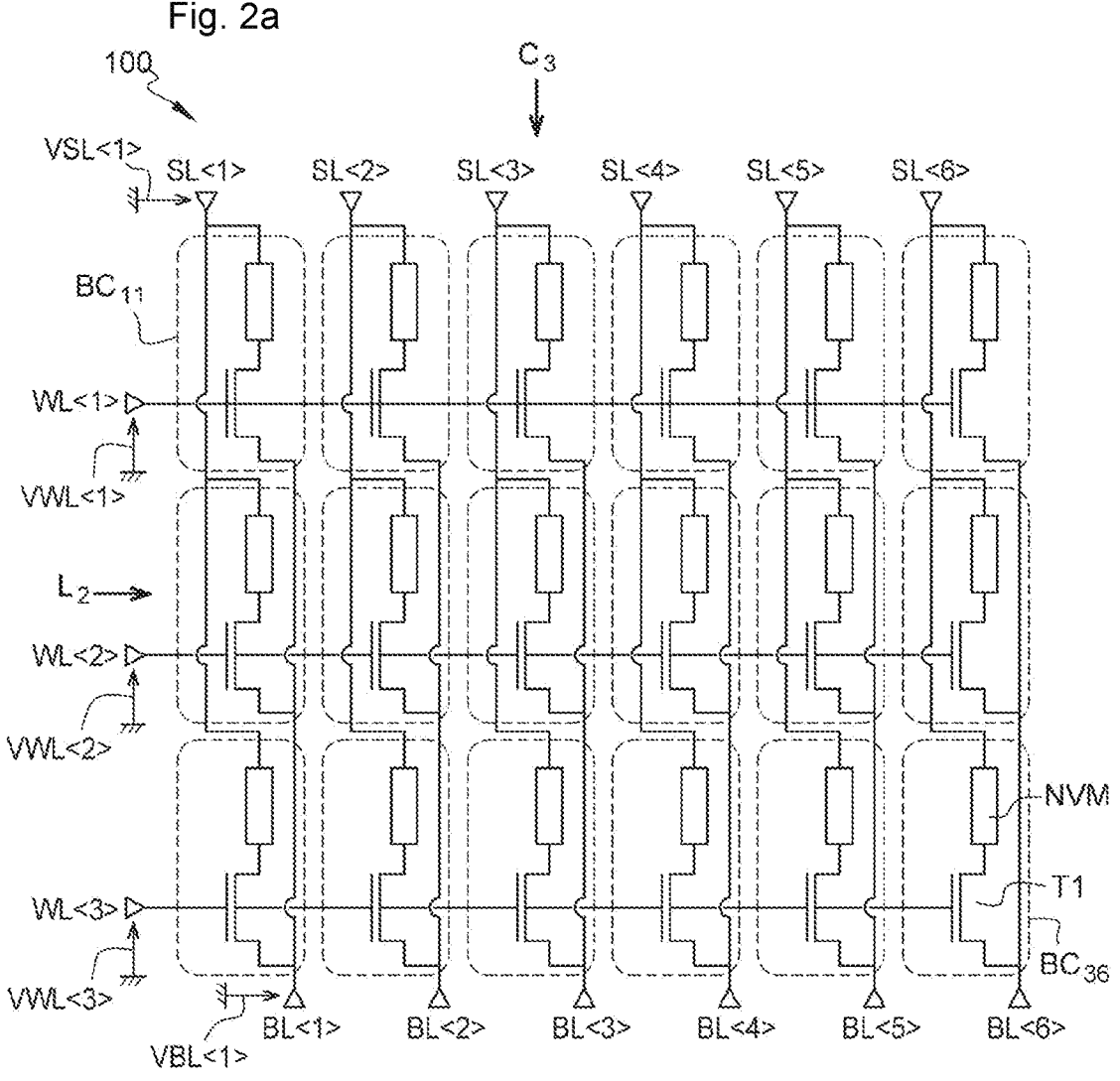
FIG. 2a illustrates a matrix array of memory cells according to the invention.

FIG. 2a illustrates a matrix array of memory cells 100 comprising the memory component NVM according to the invention. The matrix array of memory cells 100 is arranged in N rows L and M columns $C_j$, where i=1 to N and j=1 to M. In the scenario illustrated, the matrix array 100 comprises N=3 rows and M=6 columns. The matrix array of memory cells 100 comprises, for each row $L_i$, a first input node WL<i> configured to receive a selection signal VWL<i>. The matrix array of memory cells 100 furthermore comprises, for each column $C_j$, a second input node SL<j> configured to receive a first write voltage VSL<j>. The matrix array of memory cells 100 furthermore comprises, for each column $C_j$, an input/output node BL<j> configured to receive a second write voltage VBL<j> and supply a read voltage VBL<j>.

Each memory cell $BC_{ij}$ of the matrix array 100 comprises a configurable and non-volatile memory component NVM and a selection transistor T1. It will be recalled that each memory component is intended to operate in one of the two operating configurations CONF1 or CONF2. The selection transistor T1 has a gate connected to the first input node WL<i> associated with the row of said memory cell $BC_{ij}$. The transistor T1 connects the lower electrode EL1 to the input/output node BL<j> associated with the column of said memory cell $BC_{ij}$. The upper electrode EL2 of the memory component NVM of each memory cell $BC_{ij}$ is connected to the input node SL<j> associated with the column of said memory cell $BC_{ij}$. Thus, for the two operating configurations, each access operation to the memory cell $BC_{ij}$, in write mode or in read mode, consists in selecting a row by activating the transistor T1 via the selection signal VWL<i> and applying, to the pair of nodes (SL<j>, BL<j>), the voltages and/or currents needed to modify or to sample the saved datum.

This is one non-limiting illustrative example of the matrix array of memory cells 100. The invention remains applicable to other memory cell matrix array architectures. By way of alternative example, it is conceivable to produce a memory matrix array such that the input node SL<j> is shared between the memory cells $BC_{ij}$ belonging to the same row. As an alternative, it is conceivable to produce a memory matrix array such that the input node SL<j> is shared between all of the memory cells $BC_{ij}$ of the matrix array. Moreover, the pair of signals (WL<j>, BL<j>) describing the two dimensions of the plane is sufficient to select a memory cell $BC_{ij}$ of the matrix array in read mode or in write mode.

This implementation of the matrix array of memory cells makes it possible to reduce the surface area taken up by the matrix array while still remaining compatible with operation in both operating configurations requiring direct access to the electrodes EL1 and EL2 of each component. This thus gives a compact 1R1T or 1C1T cell depending on the chosen operating configuration.

Figure 2B:
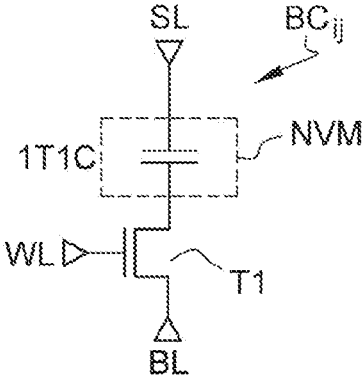
FIG. 2b illustrates a circuit diagram of a memory cell of the matrix array according to the invention in the first operating configuration.

FIG. 2b illustrates a circuit diagram of a memory cell of the matrix array according to the invention in the first operating configuration CONF1. In this operating configuration, the memory component NVM behaves like a capacitive element having a variable capacitance according to the direction of the electrical polarization of the central layer C2. The memory cell $BC_{ij}$ is thus modelled by a compact 1C1T architecture with a direct action on the electrodes EL1 and EL2 of the capacitive element when the transistor T1 is in the on state.

Figure 2C:
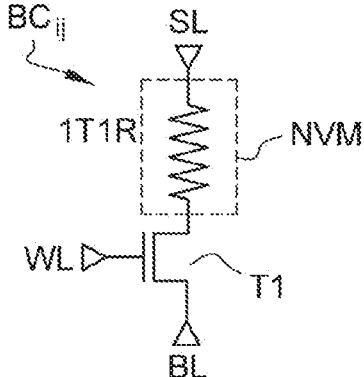
FIG. 2c illustrates a circuit diagram of a memory cell of the matrix array according to the invention in the second operating configuration.

FIG. 2c illustrates a circuit diagram of a memory cell of the matrix array according to the invention in the second operating configuration CONF2. In this operating configuration, the memory component NVM behaves like a resistive element having a variable resistance according to the length of the conductive filament through the central layer C2. The memory cell $BC_{ij}$ is thus modelled by a compact 1R1T architecture with a direct action on the electrodes EL1 and EL2 of the capacitive element when the transistor T1 is in the on state.

The transistors T1 are dimensioned so as to obtain a saturation current sufficient to supply the high electric currents associated with the resistive operation of the memory cells $BC_{ij}$, when the second operating configuration CONF2 is chosen.

Figure 3:
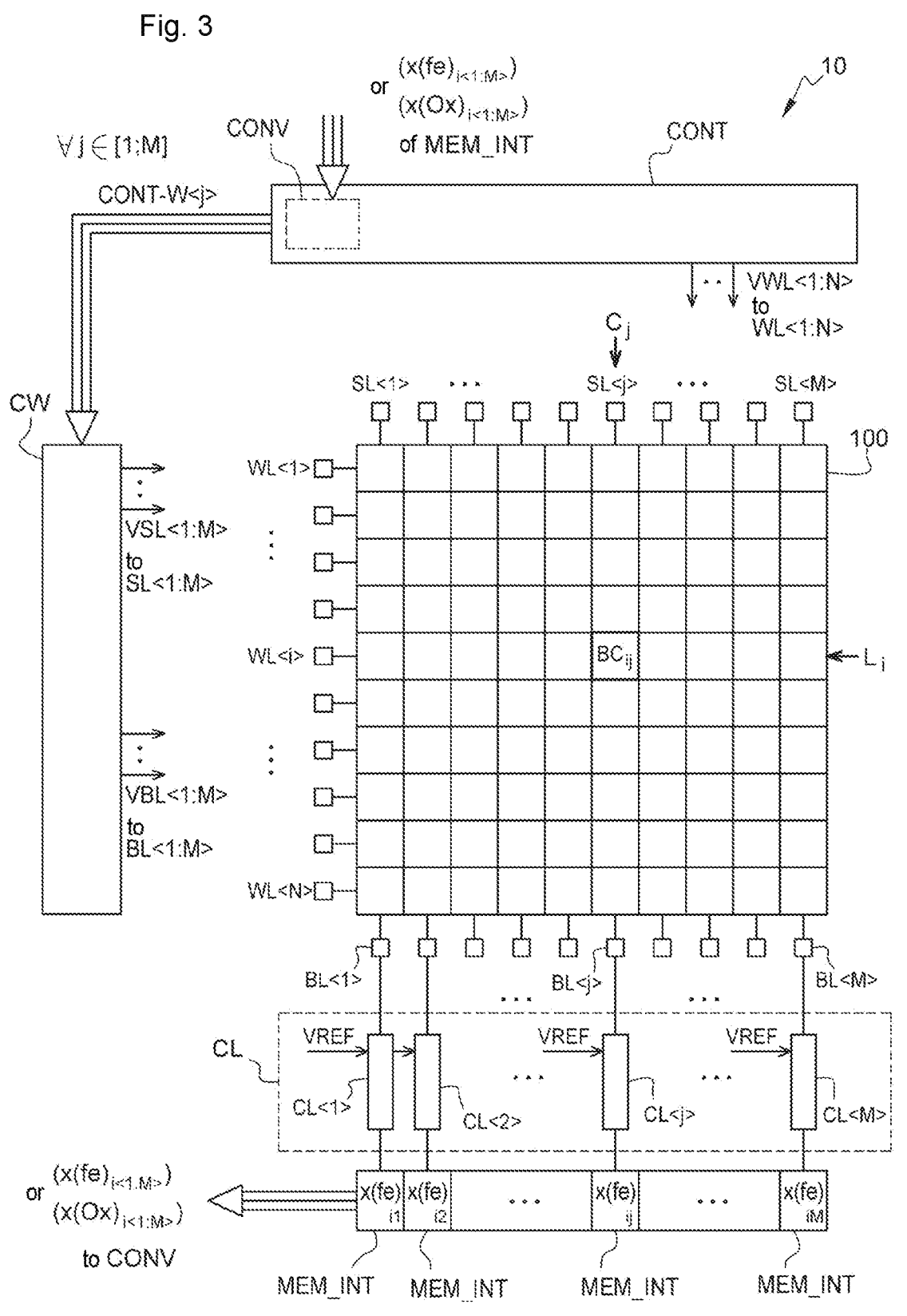

FIG. 3 illustrates a functional diagram of the architecture of a data storage circuit 10 comprising the matrix array of memory cells 100 according to the invention. The storage circuit 10 is intended to be implemented in a computer for executing algorithms having two operating phases such that the first configuration requires a large number of write (or update) operations on data stored by the storage circuit 10 and such that the second configuration requires a large number of read operations on said data.

The data storage circuit 10 comprises a write circuit CW, the matrix array of memory cells 100 (of dimensions N×M) intended to store computing data, a read circuit CL, at least one intermediate storage memory MEM_INT and control means CONT.

The write circuit CW is configured to write to each memory cell $BC_{ij}$, by supplying the first and/or the second write voltage VSL<j>, VBL<j> based on a write control signal cont_w<j>. Each of the write voltages VSL<j>, VBL<j> is able to be adapted according to the operating configuration chosen from CONF1 or CONF2. The write circuit CW is configured so as to supply the memory component with a write voltage compatible with the first operating configuration CONF1 requiring a write energy lower than that of the write operation when the second operating configuration CONF2 is chosen.

By way of example of programming convention and without loss of generality, the write circuit CW is configured to apply a positive write voltage VSL<j> to the upper electrode EL2 of the memory component via the node SL<j> in order to write a datum in the high logic state (x=1) when the second configuration CONF2 is chosen. The write circuit CW is configured to apply a positive write voltage VBL<j> to the lower electrode EL1 of the memory component via the node BL<j> in order to write a datum in the low logic state (x=0) when the second configuration CONF2 is chosen.

By way of example of programming convention and without loss of generality, the write circuit CW is configured to apply a positive write voltage VSL<j> to the upper electrode EL2 of the memory component via the node SL<j> in order to write a datum in the low logic state (x=0) when the first configuration CONF1 is chosen. The write circuit CW is configured to apply a positive write voltage VBL<j> to the lower electrode EL1 of the memory component via the node BL<j> in order to write a datum in the high logic state (x=1) when the first configuration CONF1 is chosen.

The control signals cont_w<1:M> are supplied to the write circuit CW via a bus of width equal to the number of columns M of the matrix array of memory cells 100 in order to be able to simultaneously write to the memory cells $BC_{ij}$ of a selected row $L_i$ following the activation of a predetermined selection signal $VWL_i$.

By way of non-limiting example, the read circuit CL comprises a plurality of elementary read circuits CL<j>, which are configured to supply a stored datum read signal (x(fe)$_{ij}$ or x(ox)$_{ij}$) for each memory cell depending on the result of a comparison of the read voltage VBL<j> with a predetermined reference voltage VREF. By way of example, the read voltage applied to the node BL<j> is in the form of a pulse. The reference signal VREF is generated by an external voltage source, not shown for the sake of simplification. It is conceivable to determine the value of the reference voltage in the chosen operating configuration so as to adapt the threshold that defines the logic state of the datum stored in read mode.

Each elementary read circuit CL<j> is associated with a column of the matrix array of memory cells of the same rank and it is connected to the input/output node BL<j> of the corresponding column. This makes it possible to simultaneously read the memory cells $BC_{ij}$ of a selected row $L_i$ following the activation of a predetermined selection signal $VWL_i$.

The control means CONT are intended to control the elementary read circuits CL<j> and the write circuit CW in the chosen operating configuration. The control means CONT generate control signals cont_w<1:M> to the write circuit CW so as to adapt the amplitude and/or the duration of the write voltages according to the chosen operating configuration. It will be recalled that the first operating configuration CONF1 requires less write energy than the second configuration CONF2.

In addition, the control means CONT are intended to supply the plurality of selection signals VWL<1:N> to the selection nodes WL<1:N> so as to choose a single row $L_i$ during a read or write operation.

The intermediate storage memories MEM_INT are arranged such that each intermediate storage memory MEM_INT is intended to temporarily store each read signal supplied by an elementary read circuit CL<j> CL for each read cycle. The temporary storage memories may be formed by any type of memory able to perform this function, such as registers, synchronous flip-flops, asynchronous flip-flops and memory modules, without limitation.

The temporary storage of the content of the memory cells of the row $L_i$ read during each read cycle is used for the transient phase of transitioning from one operating configuration to another. Moreover, the control means CONT are furthermore intended to drive the transition from the first configuration CONF1 to the second configuration CONF2 or vice versa based on the data stored in the internal storage memories MEM_INT. Specifically, the control means CONT comprise a conversion circuit CONV configured to convert, for each memory cell, the read signal $x(fe)_{ij}$ resulting from the first operating configuration CONF1 into a write control signal CONT_W<j> compatible with the second operating configuration CONF2. Conversely, the conversion circuit CONV is configured to convert, for each memory cell, the read signal $x(ox)_{ij}$ resulting from the second operating configuration CONF2 into a write control signal CONT_W<j> compatible with the first operating configuration CONF1. The conversion circuit CONV thus serves to translate the logic content of the memory cells of the matrix array 100 in a starting operating configuration to write control signals for generating write voltages that are compatible, in terms of write energy, with the target operating configuration.

Below, we will describe several exemplary implementations of the data storage circuit 100 in a computer having a first computing phase Ph1 having a considerable number of operations of writing to the matrix array 100 and a second computing phase Ph2 having a considerable number of operations of reading the matrix array 100.

Figure 4A:
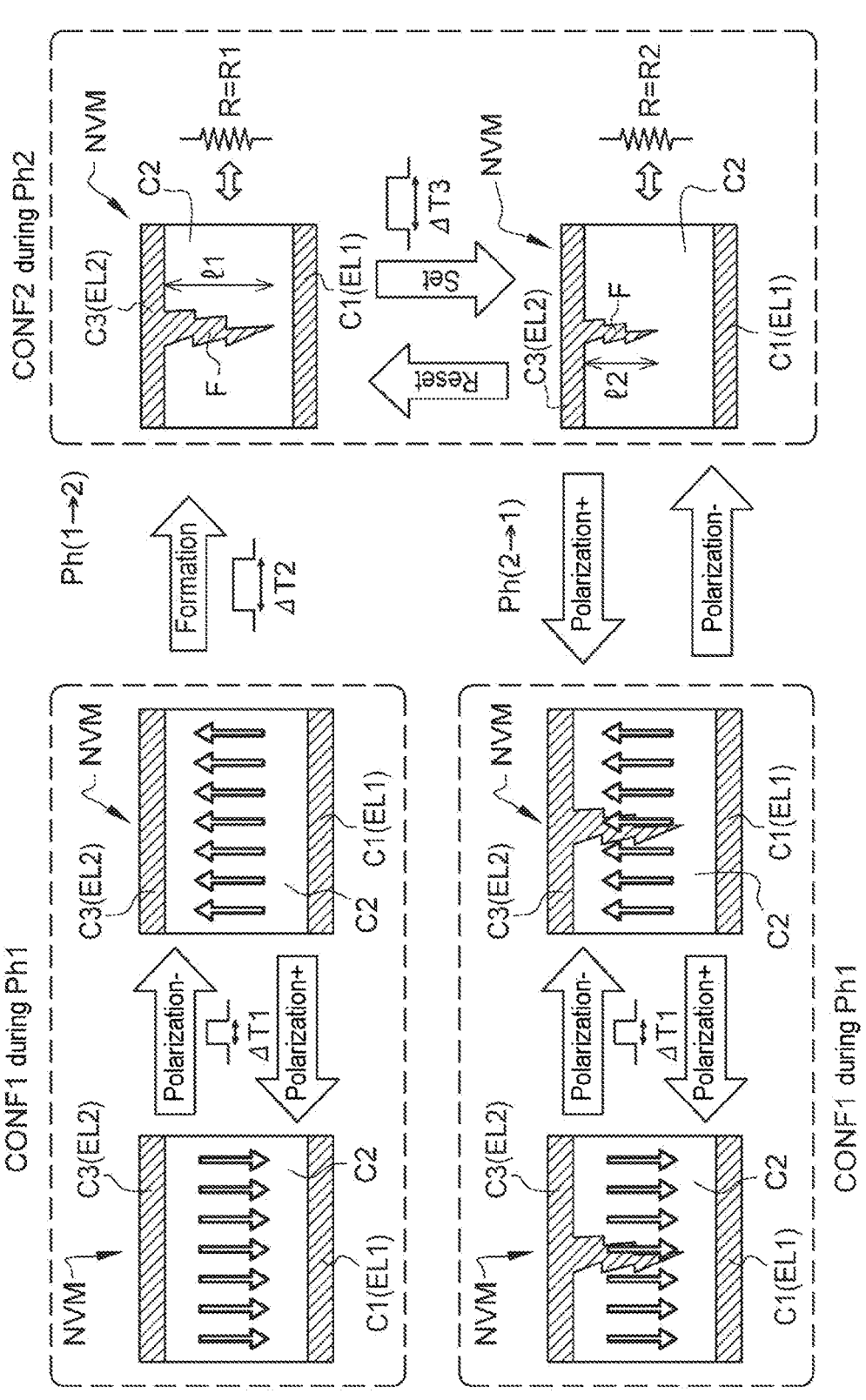
FIG. 4a illustrates a first example of the driving of the operating configuration of the memory cells of a data storage circuit according to the invention in the computing phase that is executed.

FIG. 4a illustrates a first example of the driving of the operating configuration of the memory cells of a data storage circuit according to the invention in the computing phase that is executed.

The execution of the computing algorithm by the computer circuit begins with the first computing phase PH1 formed of multiple iterations of updating the data stored in the storage circuit 10. The data storage circuit 10 is configured by the control means CONT to operate in the first operating configuration CONF1, which is more compatible with a considerable number of operations of writing to the memory cells $BC_{ij}$. Each memory component NVM of the matrix array 100 thus undergoes a plurality of operations of changing polarization direction by receiving positive write voltages on the upper electrode EL2 or lower electrode EL1. By way of example, the write voltages applied by the write circuit are square-wave pulses of duration $\Delta T1$.

Following a plurality of iterations of the first computing phase PH1, the data storage circuit 10 receives an instruction from the computer circuit to inform it of the change from the first computing phase Ph1 to the second computing phase Ph2. In response to this instruction, the control means CONT of the data storage circuit 10 trigger a transition phase Ph12 of transitioning from the first operating configuration CONF1 to the second operating configuration CONF2. The transition phase $Ph_{1\rightarrow2}$ consists of multiple iterations of steps that are repeated for each row $L_i$ of the matrix array of memory cells 100.

The first step consists in selecting the row of the matrix array of memory cells 100 by activating the corresponding selection signal VWL<i>. This step is performed by the control means CONT by activating the selection transistors T1 of the cells of the row $L_i$.

The second step consists in reading the M memory cells $BC_{ij}$ of the selected row by way of the M elementary read circuits CL<j> arranged at the bottom of each column of the matrix array. Each read signal $x(fe)_{ij}$ is stored in the intermediate storage memory MEM_INT connected to the output of the elementary read circuit CL<j>.

The third step consists in applying, to each second input node SL<j> of said row, a formation voltage in order to form a conductive filament in the second layer C2 starting from the third layer C3 in each memory cell $BC_{ij}$. By way of example, the control means CONT configure the write circuit to apply a formation voltage in the form of a square-wave pulse over a duration $\Delta T2$ long enough to create oxygen gaps in the central layer. The duration $\Delta T2$ is 1000 times greater than the duration $\Delta T1$ for changing the internal structure of the central layer C2. This thus results in the formation of the conductive filament in all of the memory components of the row $L_i$. Advantageously, the memory cells in which the filament has been formed are then set to a low resistive state (LRS). Advantageously, it is possible to use a formation voltage having an amplitude high enough to create oxygen gaps in the central layer and therefore form the conductive filament.

The fourth step consists in converting the read signals $x(fe)_{ij}$ stored in the intermediate storage memories MEM_INT during operation in the first configuration CONF1 to write control signals compatible with the second configuration CONF2. This step is performed by the converter circuit CONV, which translates the logic content of the memory cells of the row $L_i$ in the starting operating configuration to write control signals for generating write voltages that are compatible, in terms of write energy, with the operating configuration CONF2.

The fifth step consists in writing to the memory cells of said row in accordance with the write control signals compatible with the second configuration CONF2 so as to vary the length of the conductive filament that is formed. By way of example, the write circuit CW is configured to generate write voltages in the form of square-wave pulses over a duration $\Delta T3$ greater than the duration $\Delta T1$ of the write signal compatible with the first configuration CONF1 and less than the duration $\Delta T2$ of the filament formation voltage.

The described sequence is reiterated for all of the rows of the matrix array 100 until the transfer of the stored data from the first configuration CONF1 to the second configuration CONF2 is finalized.

Once the transition phase has ended, the storage circuit operates in the second configuration CONF2 compatible with the execution, by the computer, of the second computing phase Ph2 having a considerable number of operations of reading the matrix array 100. The read circuits CL are designed to measure resistance variations in the memory components NVM, and no longer a variation in an amount of charge.

It is conceivable to program the computer circuit to return to executing the first phase Ph1. In this case, the data storage circuit 10 receives an instruction from the computer circuit to inform it of the change from the second computing phase Ph2 to the first computing phase Ph1. In response to this instruction, the control means CONT of the data storage circuit 10 trigger a transition phase Ph21 of transitioning from the second operating configuration CONF2 to the first operating configuration CONF1. During this transition, the conductive filament is not destroyed as the formation of the filament is irreversible.

The transition phase $Ph_{2 \to 1}$ consists of multiple iterations of steps that are repeated for each row $L_i$ of the matrix array of memory cells 100.

The first step consists in selecting the row of the matrix array of memory cells 100 by activating the corresponding selection signal VWL<i>. This step is performed by the control means CONT by activating the selection transistors T1 of the cells of the row $L_i$.

The second step consists in reading the M memory cells $BC_{ij}$, of the selected row by way of the M read circuits CL arranged at the bottom of each column of the matrix array. Each read signal $x(ox)_{ij}$ is stored in the intermediate storage memory MEM_INT connected to the output of the elementary read circuit CL<j>.

The third step consists in applying, to each second input node SL<j> of said row, a reset voltage to the lower electrode EL1 (RESET operation) so as to reduce the length of the filament. This reset makes it possible to minimize operating disruption in the first configuration CONF1 (destination of the transition Phe 1) caused by the resistive filament coming from the second configuration CONF2 (starting point of the transition Phe 1).

Finally, a data conversion step performed by the conversion circuit CONV by reading the intermediate storage memories MEM_INT is performed in a manner similar to the transition phase $Ph_{1 \to 2}$, but with a translation in the opposite direction.

Once the transition phase $Ph_{2 \to 1}$ has ended, the storage circuit 10 operates in the first configuration CONF1 compatible with the execution, by the computer, of the first computing phase Ph1 having a considerable number of operations of writing to the matrix array 100. The read circuits CL are designed to measure variations in the amount of charge in the memory components NVM as explained above, so as to utilize the polarization variations and ignore the existence of the conductive filament.

The advantage of this configuration is that it offers the designer programming flexibility while still utilizing the compatibility of each memory operating configuration according to the invention with the read/write requirements of the computing phase that is performed.

Generally speaking, the formation voltage in a transition phase $Ph_{1 \to 2}$ and the reset voltage in a transition phase $Ph_{2 \to 1}$ are referenced by the term "transformation voltage".

Figure 4B:
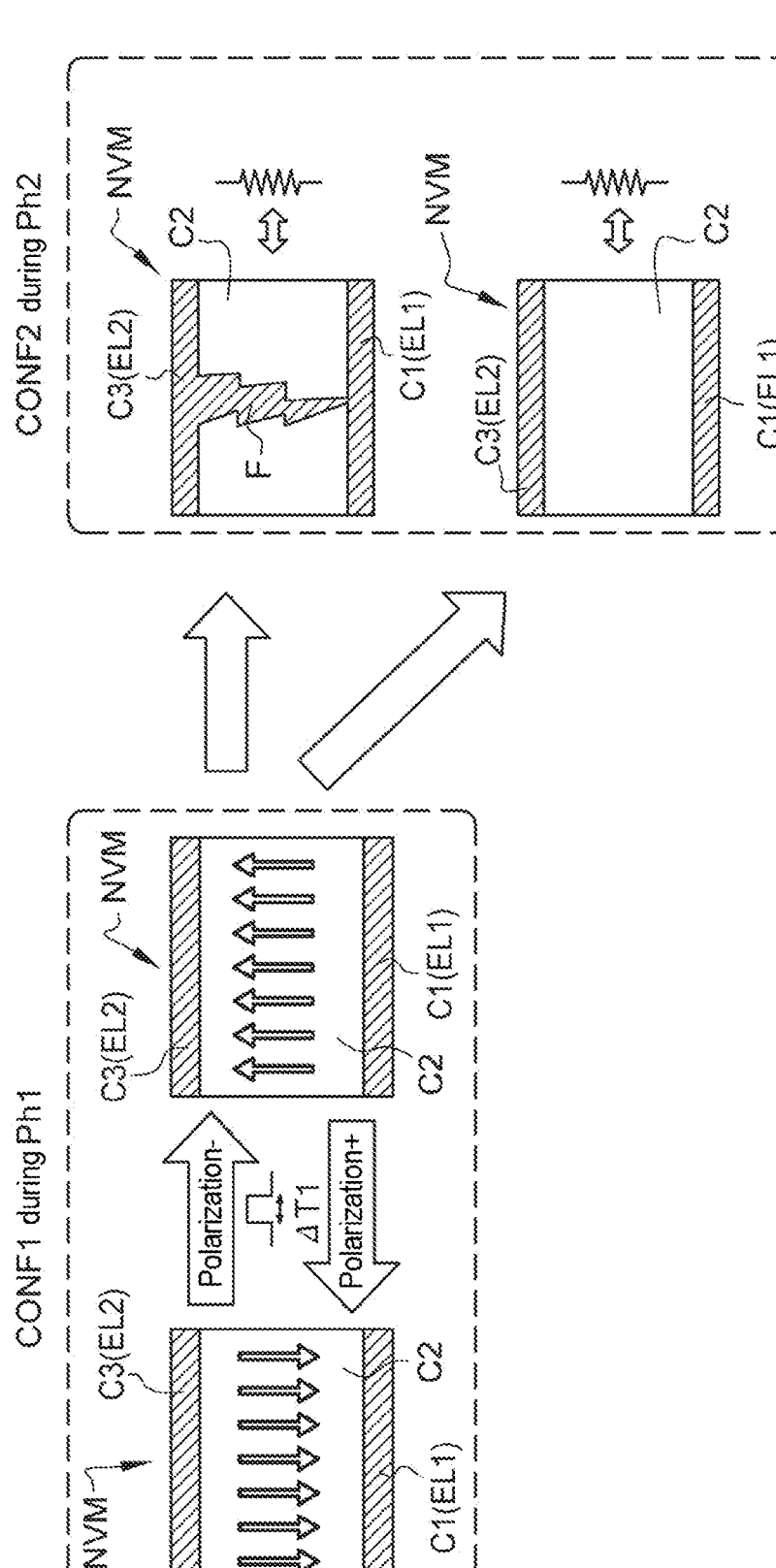
FIG. 4b illustrates a second example of the driving of the operating configuration of the memory cells of a data storage circuit according to the invention in the computing phase that is executed.

FIG. 4b illustrates a second example of the driving of the operating configuration of the memory cells of a data storage circuit according to the invention in the computing phase that is executed.

The second example of FIG. 4b differs from the first example as follows: the transition phase of transitioning from the first computing phase Ph1 to the second computing phase Ph2 is irreversible. The algorithm requires only a single first phase Ph1 that is executed initially, and then the data stored by the matrix array 100 are fixed in the transition phase Phe 1. Specifically, during the conversion step described above, the conversion circuit CONV configures the write circuit CW to choose between the following two possibilities:

If the memory cell $BC_{ij}$ stores a datum in a high logic state $(x(fe)_{ij}=1)$, the voltage applied to the upper electrode EL2 is maintained until the two electrodes E1 and E2 are short-circuited via a filament passing through the entire thickness of the central layer C2. The memory cell behaves like a low-resistance resistive element.

If the memory cell $BC_{ij}$ stores a datum in a low logic state $(x(fe)_{ij}=0)$, there is no need to form the conductive filament and the structure of the memory component NVM remains intact. The memory cell behaves like an infinite-resistance resistive element.

Such a use obviously does not make full use of the capabilities of the mixed technology according to the invention, but exhibits the advantage of reducing the write circuitry and of a better read resolution of the data since the difference between the two possible resistive states is considerable. Indeed, the high resistive state corresponds to a resistance greater than 10 Mohm and the low resistive state corresponds to a resistance less than 5 kohm.

Figure 5A:
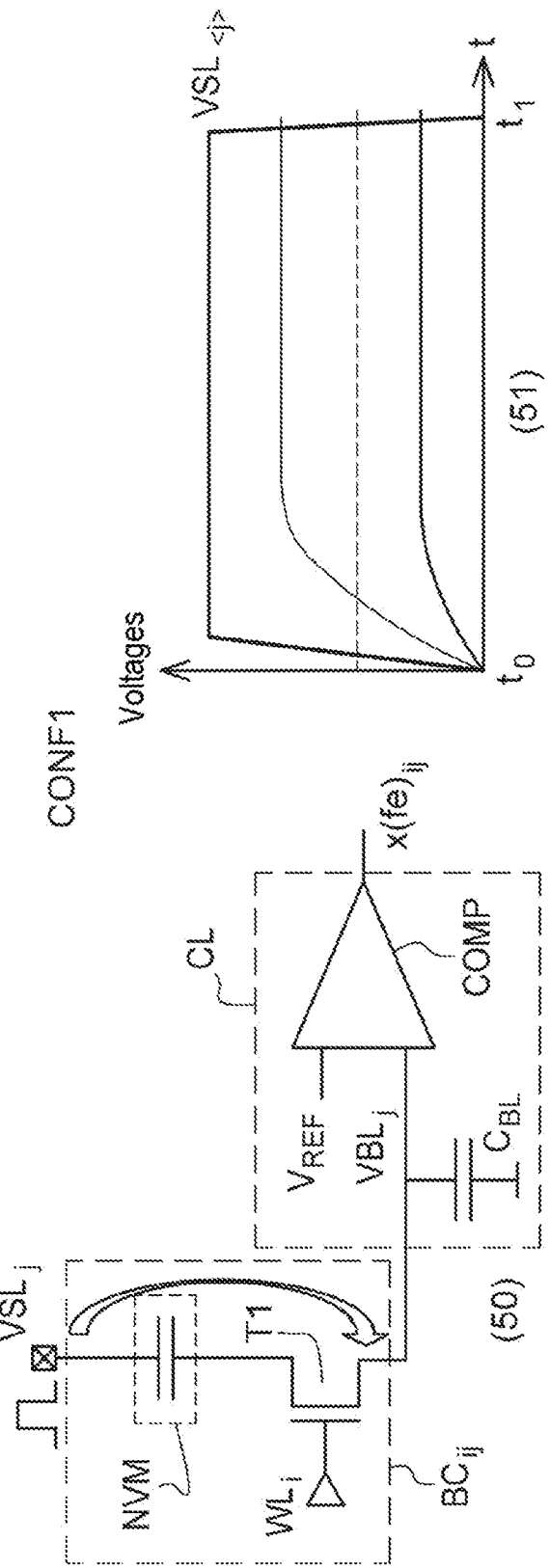
FIG. 5a illustrates a read mechanism in the first operating configuration implemented by a first embodiment of the read circuit.

FIG. 5a illustrates a read mechanism in the first operating configuration CONF1 implemented by a first embodiment of the read circuit. The circuit diagram (50) shows a memory cell $BC_{ij}$ in capacitive operation with an elementary read circuit CL<j> formed by a comparator circuit COMP. The comparator COMP receives, on a first input, a reference voltage VREF and, on a second input, the read voltage VBL<j> via the transistor T1 put into the on state. The comparator circuit COMP comprises an output for supplying the binary read signal $x(fe)_{ij}$ according to the result of the comparison. The reference signal VREF is generated by an external voltage source, not shown for the sake of simplification. There is also a parasitic capacitance $C_{BL}$ between the node VBL<j> and electrical earth that is used to receive the charge supplied by the memory component NVM during the read operation. The voltage across the terminals of the parasitic capacitance $C_{BL}$ is proportional to the amount of charge supplied by the capacitive component NVM during the read operation.

The diagram 51 shows the variation over time of the various electrical signals involved in the read operation in the first operating configuration CONF1.

The procedure of reading the memory cell consists in charging the node BL<j> by applying a voltage to the node SL<j>, and therefore through the memory cell $BC_{ij}$ having a capacitive behaviour. The first step consists in selecting the memory cell to be read by putting the selection transistor (T1) corresponding to said memory cell into the on state. Next, the read node BL<j> associated with the memory cell $BC_{ij}$ is set to a zero voltage by the write circuit CW. This corresponds to the initial state of the read circuit at the time t0 of the diagram 51. Next, a read pulse is applied to the second input node SL<j> associated with said column in order to charge the input/output node BL<j> associated with the same column. In response to this stimulation, the evolution dynamics of the read voltage VBL<j> vary according to the amount of charge stored beforehand in the memory component NVM acting as a capacitor: If the stored datum x=1, the read voltage VBL<j> increases in a rapid slope during the charging of the capacitance $C_{BL}$ so as to reach a level of equilibrium higher than the reference voltage VREF in steady state. If the stored datum x=0, the read voltage VBL<j> increases in a slow slope during the charging of the capacitance $C_{BL}$ so as to reach a level of equilibrium lower than the reference voltage VREF in steady state.

As a result, the digital signal x(fe)$_{ij}$ supplied by the output of the comparator represents the logic state of the datum stored beforehand in the memory component NVM. If VBL<j>>> VREF, x(fe)$_{ij}$=1 is observed on the output of the comparator COMP for a stored datum x=1. Otherwise, x(fe) $_{ij}$=0 is observed.

Figure 5B:
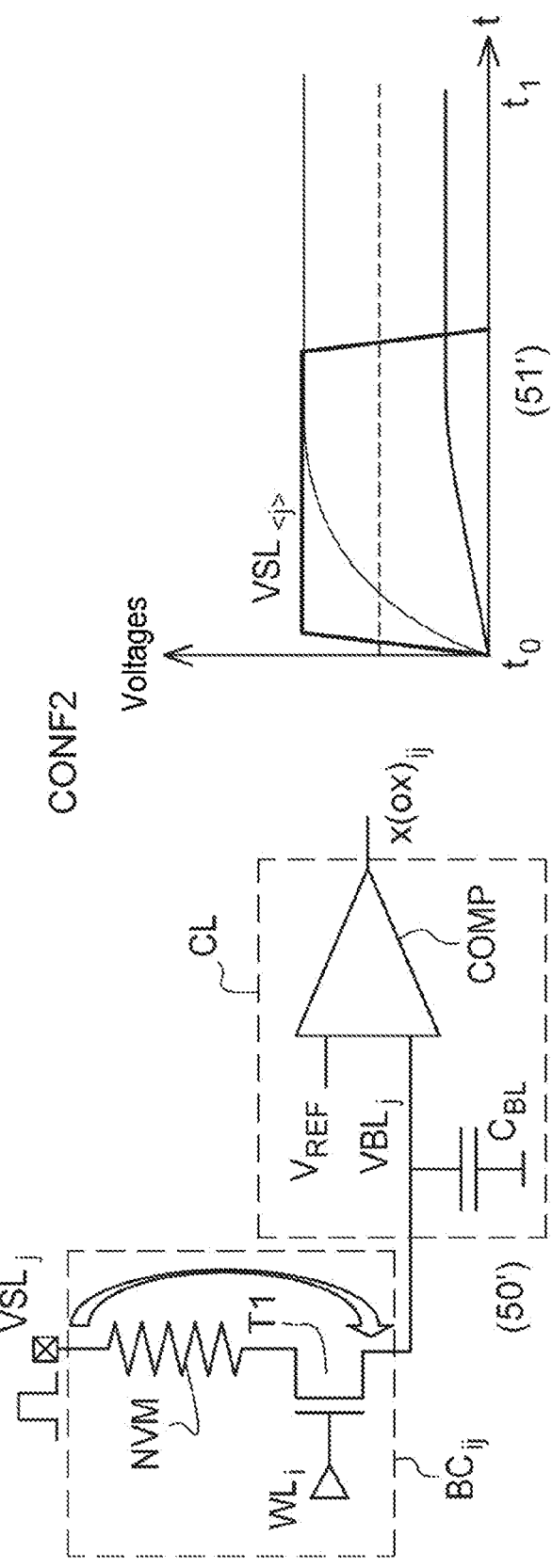
FIG. 5b illustrates a read mechanism in the second operating configuration implemented by the first embodiment of the read circuit.

FIG. 5b illustrates a read mechanism in the second operating configuration CONF2 implemented by the first embodiment of the read circuit described in FIG. 5b. The circuit diagram 50' shows a memory cell BC$_{ij}$ in resistive operation with an elementary read circuit CL<j> formed by a comparator circuit COMP. The diagram 51' shows the variation over time of the various electrical signals involved in the read operation in the second operating configuration CONF2. The first step consists in selecting the memory cell to be read by putting the selection transistor T1 corresponding to said memory cell into the on state. Next, the read node BL<j> associated with the memory cell BC$_{ij}$ is set to a zero voltage by the write circuit CW. This corresponds to the initial state of the read circuit at the time t0 of the diagram 51'. Next, a read pulse is applied to the second input node SL<j> associated with said column in order to charge the input/output node BL<j> associated with the same column.

Reading the memory cell consists in estimating the value of the resistance of the device NVM. The equivalent circuit obtained when the transistor T1 is in the on state is an RC circuit formed by the resistance of the memory component NVM in series with the parasitic capacitive element $C_{BL}$. The initially discharged capacitive element $C_{BL}$ charges in accordance with a time constant $T=RC_{BL}$. A slower evolution of the voltage BL<j> with a larger time constant T is thus observed when the memory component has a high resistive state (HRS). A faster evolution of the voltage BL<j> with a smaller time constant T is observed when the memory component has a low resistive state (LRS). The duration of the applied pulse should be short enough to sample the voltage BL<j> during the transient state and avoid reaching the steady state of the charge of the capacitive element $C_{BL}$.

Figure 5C:
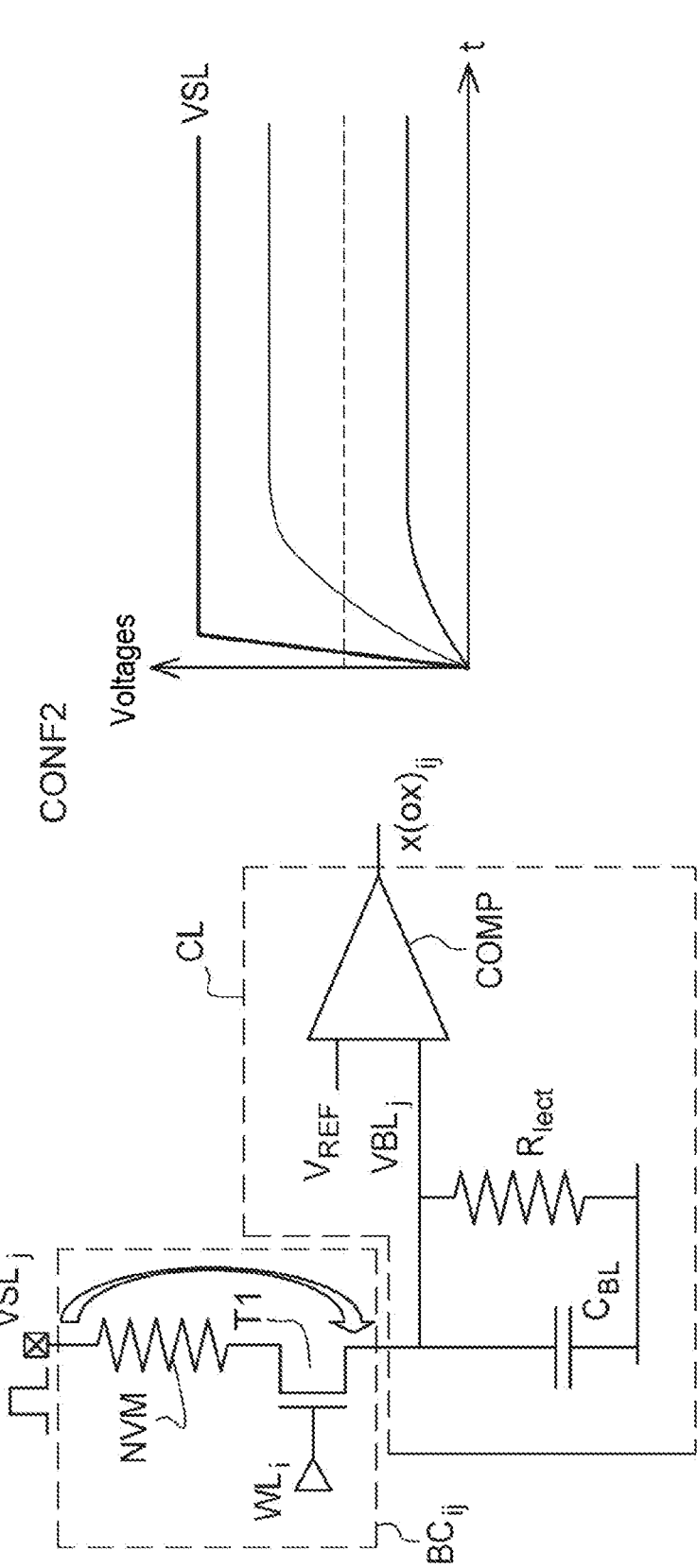
FIG. 5c illustrates an alternative read mechanism in the second operating configuration implemented by the first embodiment of the read circuit.

FIG. 5c illustrates a second embodiment of the elementary read circuit CL<j> compatible with the second operating configuration. The read circuit illustrated in FIG. 5c differs from that of FIG. 5b through the addition to the elementary read circuit CL<j> of a read resistor $R_{lect}$ connected in parallel with the capacitive element $C_{BL}$. The read resistor $R_{lect}$ makes it possible to form a voltage divider bridge such that the static value of the voltage of VBL<j> (steady state) varies with the value of the resistance of the memory component NVM behaving like a variable resistor according to the value of the stored datum. This alternative eliminates the constraint of having a short read pulse. Specifically, there is no longer any need to compare the voltages during the transient state since the static value of VBL<j> depends on the division ratio of the voltage divider bridge formed by the read resistor $R_{lect}$ and the memory component NVM.

Figure 6A:
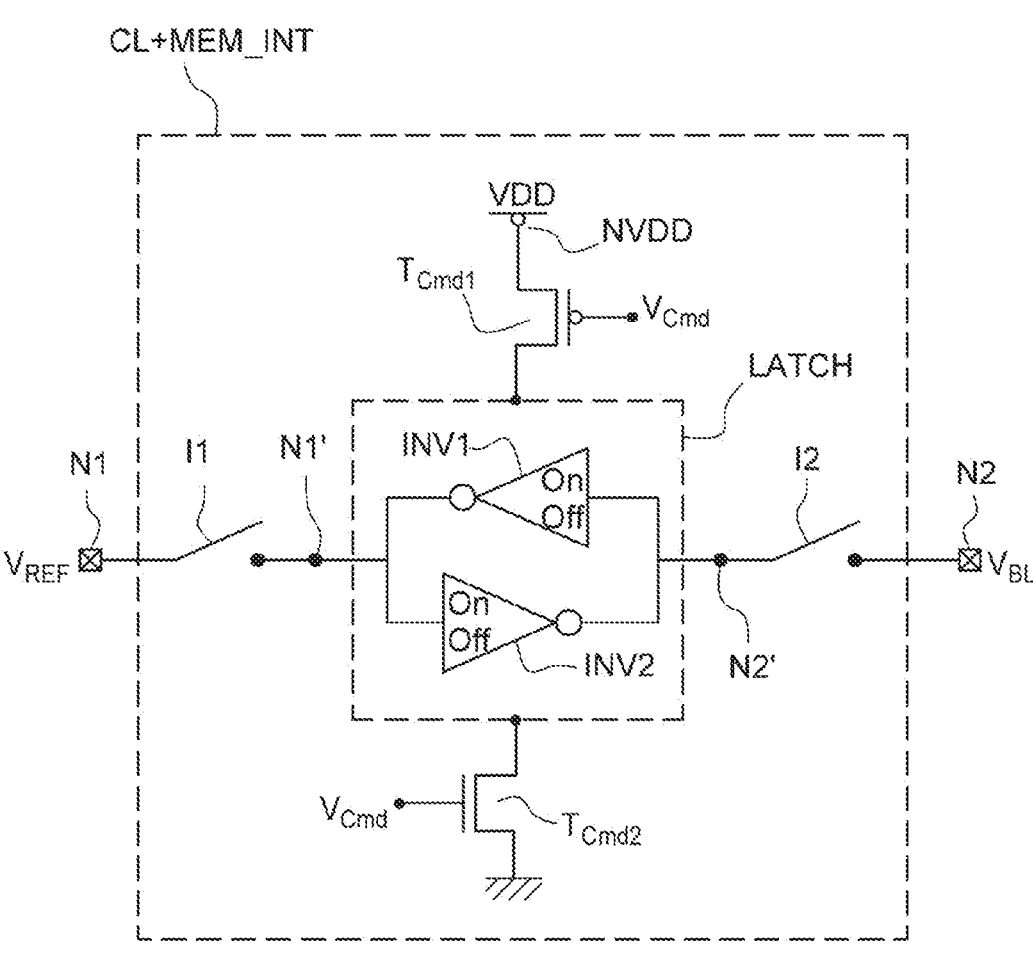
FIG. 6a illustrates a combined embodiment of the read circuit and of an intermediate storage memory according to the invention.

FIG. 6a illustrates a combined embodiment of the read circuit CL and of an intermediate storage memory MEM_INT according to the invention. This is an embodiment in which the read circuit CL and the intermediate storage memory MEM_INT associated therewith are formed in a single circuit CL+MEM_INT, called "detection and storage circuit".

The detection and storage circuit CL+MEM_INT comprises a latch flip-flop LATCH having two input/output nodes N1' and N2'; a first input node N1 intended to receive the reference voltage VREF and connected to the first input/output node N1' of the latch flip-flop via a first switch I1; and a second input node N2 intended to receive the read voltage VBL<j> and connected to the second input/output node N2' of the latch flip-flop via a second switch I2.

The latch flip-flop LATCH consists of two inverter circuits INV1 and INV2 connected head-to-tail such that the output of each one supplies the input of the other. This then gives intermediate memory operation in the steady state of the latch flip-flop LATCH. This is possible when connecting each of the two nodes N1' and N2' to be compared to each of the inputs/outputs of the inverters. In transient state, applying two different voltages to the two nodes N1' and N2' disturbs the state of equilibrium of the latch flip-flop LATCH, which toggles to a new state of equilibrium according to the comparison between the two different voltages applied to the nodes N1' and N2'.

The two inverter circuits INV1 and INV2 are connected to a supply node NVDD via a first control transistor $T_{cmd1}$. The two inverter circuits INV1 and INV2 are connected to an electrical earth node via a second control transistor $T_{cmd2}$. When the first control node and the second control node $T_{cmd1}$ and $T_{cmd2}$ are in the on state, the inverter circuits INV1 and INV2 are supplied with the supply voltage VDD. When the first control node and the second control node $T_{cmd1}$ and $T_{cmd2}$ are in the off state, the inverter circuits INV1 and INV2 are isolated from the supply voltage VDD, and therefore the latch flip-flop LATCH is deactivated.

By way of example, a description is given of the progress of the read operation implemented by the detection and storage circuit CL+MEM_INT when the first operating configuration CONF1 is chosen. The first step consists in putting the first switch I1 and the second switch I2 into an off state in order to isolate the latch flip-flop LATCH.

The second step consists in selecting, by way of the control means CONT, the memory cell to be read by activating the selection transistor T1 corresponding to said memory cell.

The third step consists in setting the input/output node BL<j> associated with said column to a zero voltage by way of the write circuit CW.

The fourth step consists in applying, by way of the write circuit CW, a read voltage, in the form of a pulse by way of example, to the second input node SL<j> associated with said column.

This step makes it possible to precharge the input/output node BL<j> with read voltage.

At the same time, the first and the second switch I1 and I2 are put into an on state, and the first and the second control node $T_{cmd1}$ and $T_{cmd2}$ are put into the off state. This makes it possible to deactivate the latch flip-flop LATCH so as to make it possible to precharge the nodes N1' and N2' with the read voltage.

Next, during the fifth step, the first and the second switch I1 and I2 are put into an on state and the first and the second control node $T_{cmd1}$ and $T_{cmd2}$ are in the on state so as to activate the latch flip-flop LATCH. The voltages precharged beforehand on the nodes N1' and N2' disrupt the equilibrium of the latch flip-flop LATCH. This disruption triggers a comparison mechanism for comparing the read voltage VBL<j> on the node N2' with reference voltage VREF on the node N1'. The latch flip-flop LATCH returns to a state of equilibrium by toggling according to the comparison between the two voltages VREF and VBL<j>. If VBL<j> is greater than VREF, the node N2' toggles to a high logic state (x=1) and the node N1' toggles to a low logic state (x=0). If VBL<j> is lower than VREF, the node N2' toggles to a low logic state (x=0) and the node N1' toggles to a high logic state (x=1). The detection and storage circuit CL+MEM_INT thus performs the function of a comparator circuit in the context of a read operation.

The final step consists in putting the first and the second switch I1 and I2 into an off state in order to isolate the latch flip-flop from its environment and thus temporarily store the read signal according to the state of the pair of nodes N1' and N2' resulting from the comparison operation. The detection and storage circuit CL+MEM_INT thus performs the temporary storage function able to be used for the conversion during a transition phase of transitioning from one operating configuration to another.

The advantage of this embodiment is that of reducing the surface area taken up by the circuit in comparison with an implementation with a read circuit CL and temporary storage memories MEM_INT formed by two separate circuits.

Figure 6B:
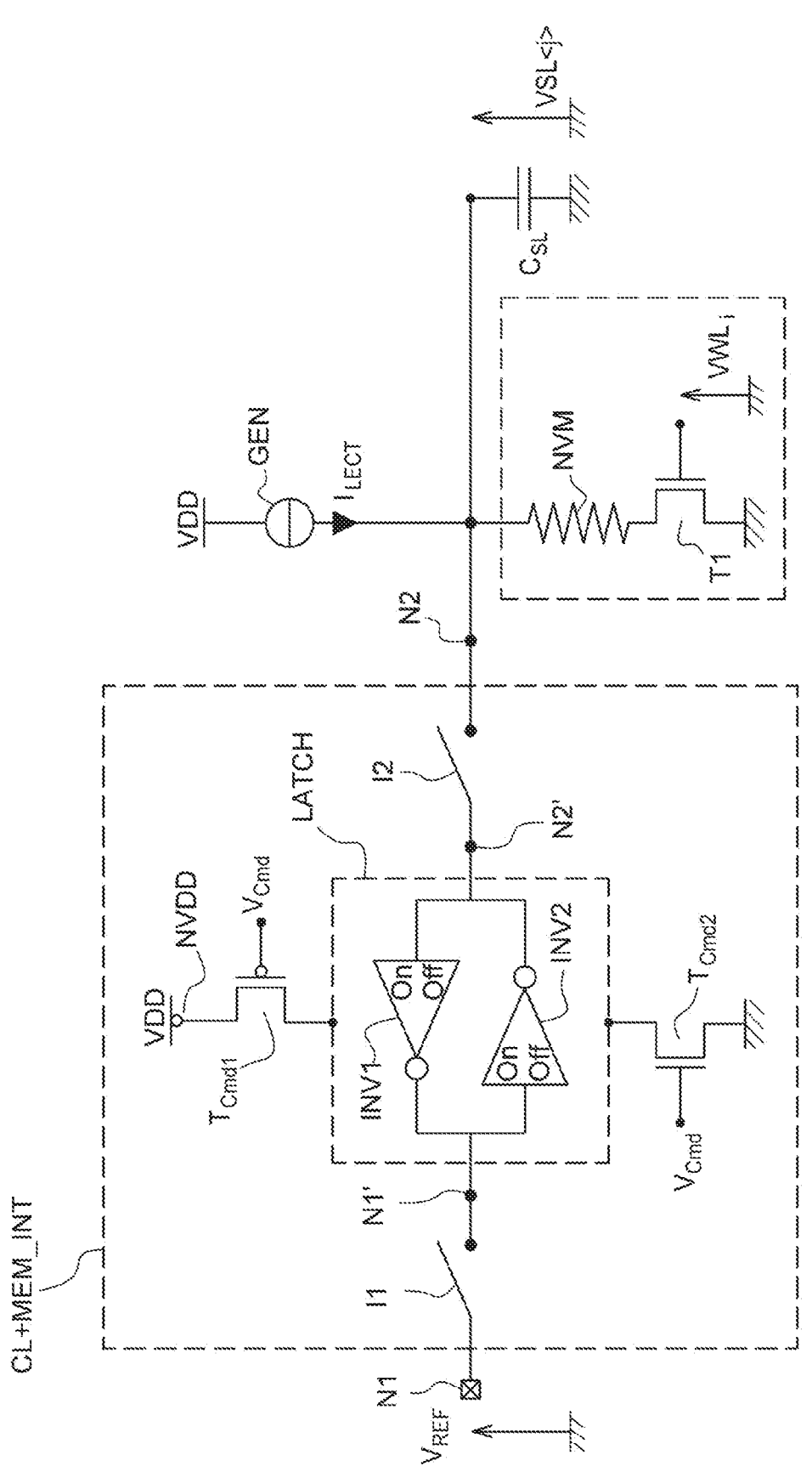

FIG. 6b illustrates a read and storage mechanism in the second operating configuration implemented by the combined circuit CR+MEM_INT of FIG. 6a.

In this exemplary illustration, the second input node N2 intended to receive the read voltage VBL<j> is connected to a constant current source GEN generating a read current $I_{lect}$. The read current $I_{lect}$ flows through the resistive element corresponding to the memory component NVM when the latter operates in the second operating configuration CONF2. The current source GEN may be formed by a current mirror, which may be activated or deactivated in accordance with control signals that are not shown for the sake of simplification. The progress of the read operation implemented by the detection and storage circuit CL+MEM_INT for the second operating configuration CONF2 differs from the progress described above for the first operating configuration CONF1 as follows:

the fourth step consists in activating the current mirror GEN so as to supply an electric current with a predetermined strength flowing through the resistive element NVM with the switches I1 and I2 in an on state and the supply to the two inverters INV1 and INV2 cut off. This makes it possible to precharge the node N2' to a potential corresponding to the voltage drop caused by the resistance of the resistive element NVM. The duration of this step is predetermined by the designer so as to achieve the steady state on the node N2'. The duration is of the order of a few tens of nanoseconds.

The fifth step consists in activating the supply to the inverters INV1 and INV2 and therefore activating the latch flip-flop LATCH while at the same time putting the switches I1 and I2 into an off state so as to isolate the latch flip-flop LATCH from the node N2. The outputs (N1', N2') of the latch flip-flop LATCH therefore toggle to a high or low logic state without charging or discharging the node N2. From a consumption point of view, this has the advantage of limiting the variations in the voltage $V_{SL}$ on the upper electrode of the memory component NVM.

In the following section, we will describe one non-limiting example of the application context of the data storage circuit 10 according to the invention. Artificial neural network computer circuits are involved. Artificial neural networks are computer models that mimic the operation of biological neural networks. Artificial neural networks comprise neurons interconnected with one another by synapses, and each synapse is attached to a synaptic weight (or synaptic coefficient), implemented for example by digital memories.

In the context of embedded artificial intelligence, electronic chips implementing (deep and/or pulsed) neural networks require a high memory capacity to store the parameters of these networks. The implementation of neural networks may be broken down into two phases: learning and inference.

The learning phase consists in modifying the synaptic weights of the network in line with what is called a learning algorithm so as to make them converge on values such that the network accomplishes the task for which it is trained. The inference phase consists in applying the previously learned task to the input data.

In the case of a neural network accelerator, the life of the system begins with an intensive learning phase. Following this learning operation, the circuit performs inference operations. This means that artificial intelligence systems including a learning operation increasingly have to implement methods for modifying these parameters in order to meet a given task. From a point of view of a means for storing the parameters of the network, and more particularly synaptic coefficients, the two abovementioned operations have an important difference:

during learning, the synaptic weights are regularly modified, and therefore the memory cells storing values thereof undergo multiple iterations of intensive rewrite operations.

during inference, the synaptic weights are fixed and the memory cells in question no longer undergo any write action, but a considerable number of read operations.

It is thus possible to use the data storage circuit 10 according to the invention in an artificial neural network computer circuit as follows: the memory cells NVM are intended to store the synaptic coefficients of the network. The data storage circuit 10 is configured in the first operating configuration CONF1 during the execution of a learning phase (intensive writing) by the artificial neural network. The data storage circuit 10 is configured in the second operating configuration CONF2 during the execution of an inference phase (intensive reading) by the artificial neural network. This implementation of the data storage circuit 10 according to the invention makes it possible to improve the technological robustness, the reliability and the energy consumption of the neural network computer circuit by adapting the storage means with the constraints of the computing phase that is performed during the life of the computer circuit.

The invention claimed is:

1. A data storage circuit comprising a matrix array of memory cells ($BC_{ij}$), of N rows ($L_i$) and M columns ($C_j$), produced on a semiconductor substrate, comprising:

for each row ($L_i$), a first input node (WL<i>) configured to receive a selection signal (VWL<i>);

at least one second input node (SL<j>) configured to receive a first write voltage (VSL<j>);

for each column (C), an input/output node (BL<j>) configured to receive a second write voltage (VBL<j>) and supply a read voltage (VBL<j>);

the memory cells ($BC_{ij}$) being configurable and non-volatile; each one being intended to operate in either one of two operating configurations (CONF1, CONF2);

the first operating configuration (CONF1) corresponding to a ferroelectric random-access memory;

and the second operating configuration (CONF2) corresponding to a metal-oxide resistive random-access memory;

each memory cell ($BC_{ij}$) comprising:

a stack of thin layers (NVM) in the following order: a first layer (C1) made of an electrically conductive material forming a lower electrode (EL1), a second layer (C2) made of a dielectric and ferroelectric material, a third layer (C3) made of electrically conductive material forming an upper electrode (EL2) connected to the second input node (SL<j>) associated with the column of said memory cell ($BC_{ij}$);

a selection transistor (T1) having a gate connected to the first input node (WL<i>) associated with the row of said memory cell ($BC_{ij}$) and connecting the lower electrode (EL1) to the input/output node (BL<j>) associated with the column of said memory cell ($BC_{ij}$);

the data storage circuit being configured, upon each transition from one operating configuration, called starting configuration, to the other operating configuration, called finishing configuration (CONF1, CONF2), to:

read each memory cell ($BC_{ij}$) in the starting configuration and temporarily store a resulting read signal;

apply a transformation voltage to each memory cell ($BC_{ij}$);

convert each read signal in the starting configuration into a write signal compatible with the finishing configuration;

rewrite each memory cell ($BC_{ij}$) based on the write signals compatible with the starting configuration.

2. The data storage circuit according to claim 1, furthermore comprising:

a write circuit (CW) for writing to each memory cell ($BC_{ij}$) by supplying the first or the second write voltage (VSL<j>, VBL<j>) based on a write control signal (cont_w);

each of the write voltages (VSL<j>, VBL<j>) being able to be adapted in accordance with the chosen operating configuration (CONF1, CONF2); the duration and/or the amplitude of said write voltage (VSL<j>, VBL<j>) associated with the first operating configuration being lower than that associated with the second operating configuration (CONF2);

a read circuit (CL) for supplying a read signal ($x(fe)_{ij}$, $x(ox)_{ij}$) for each selected memory cell.

3. The data storage circuit according to claim 2, furthermore comprising:

at least one intermediate storage memory (MEM_INT) intended to temporarily store each read signal ($x(fe)_{ij}$) when the first configuration (CONF1) is chosen;

control means (CONT) for controlling the read circuits and the write circuit in accordance with the chosen configuration (CONF1, CONF2) and supplying the row ($L_i$) selection signal (VWL<i>).

4. The data storage circuit according to claim 3, wherein the control means (CONT) comprise a conversion circuit (CONV) configured to convert, for each memory cell, the read signal ($x(fe)_{ij}$) resulting from the first operating configuration (CONF1) into a write control signal (CONT_W<j>) compatible with the second operating configuration (CONF2).

5. The data storage circuit according to claim 4, wherein the write circuit (CW) is configured to apply, to each second input node (SL<j>), a transformation voltage in order to form a conductive filament in the second layer (C2) starting from the third layer (C3) in each memory cell ($BC_{ij}$), said filament corresponding to a low resistive state.

6. The data storage circuit according to claim 2, wherein the at least one intermediate storage memory (MEM_INT) is furthermore intended to store each read signal ($x(ox)_{ij}$) when the second configuration (CONF2) is chosen;

and wherein the conversion circuit (CONV) is configured to convert, for each memory cell, the read signal ($x(ox)_{ij}$) resulting from the second operating configuration (CONF2) into a write control signal (CONT_W<j>) compatible with the first operating configuration (CONF1).

7. The data storage circuit according to claim 2, wherein the read circuit (CL) comprises a plurality of elementary read circuits (CL<j>) each comprising:

a comparator (COMP) for comparing the read voltage (VBL<j>) and a reference voltage (VREF) in order to supply the read signal ($x(fe)_{ij}$, $x(ox)_{ij}$) for the memory cell currently being read.

8. The data storage circuit according to claim 2, wherein the at least one intermediate storage memory (MEM_INT) is a synchronous flip-flop.

9. The data storage circuit according to claim 7, wherein the read circuit for each column ($C_j$) is configured to perform a read operation by executing the following steps:

selecting the memory cell to be read by putting the selection transistor (T1) corresponding to said memory cell into the on state;

setting the input/output node (BL<j>) associated with said column to a zero voltage;

applying a read pulse to the second input node (SL<j>) associated with said column in order to charge the input/output node (BL<j>) associated with the same column;

comparing the read voltage (VBL<j>) on the input/output node (BL<j>) with the reference voltage (VREF).

10. The data storage circuit according to claim 2, wherein the read circuit (CL) and the at least one intermediate storage memory (MEM_INT) are formed by a single detection and storage circuit (CL+MEM_INT) comprising:

a latch flip-flop (LATCH) having two input/output nodes (N1', N2');

a first input node (N1) being intended to receive the reference voltage (VREF) and being connected to the first input/output node (N1') of the latch flip-flop via a first switch (I1);

a second input node (N2) being intended to receive the read voltage (VBL<j>) and being connected to the second input/output node (N2') of the latch flip-flop via a second switch (I2), the latch flip-flop (LATCH) being connected to a supply node (NVDD) via a first control transistor ($T_{cmd1}$) and to electrical earth via a second control transistor ($T_{cmd2}$).

11. The data storage circuit according to claim 10, wherein the read circuit for each column ($C_j$) is configured to perform a read operation by executing the following steps:

selecting the memory cell to be read by activating the selection transistor (T1) corresponding to said memory cell;

setting the input/output node (BL<j>) associated with said column to a zero voltage;

putting the first and the second transistor (I1, I2) into an on state and putting the first and the second control transistor ($T_{cmd1}$, $T_{cmd2}$) into an off state in order to deactivate the latch flip-flop (LATCH), applying a read pulse to the second input node (SL<j>) associated with said column in order to charge the input/output node (BL<j>) associated with the same column;

putting the first and the second switch (I1, I2) into an on
state in order to compare the read voltage (VBL<j>) on
the input/output node (BL<j>) with the reference volt-
age (VREF) and supply the read signal (x(fe)$_{ij}$, x(ox)$_{ij}$);

putting the first and the second switch (I1, I2) into an off
state in order to temporarily store the read signal
(x(fe)$_{ij}$, x(ox)$_{ij}$).

12. The data storage circuit according to claim 2, wherein
the write circuit is configured to rewrite the data read from
a memory cell after each read operation when the first
configuration (CONF1) is chosen.

13. The data storage circuit according to claim 2, wherein
the write circuit is configured to apply a write voltage having
an amplitude and/or a duration sufficient to establish a
conductive filament passing through an irreversible low
resistive state.

14. The data storage circuit according to claim 1, wherein:

the first (C1) and the third (C3) layer are made of titanium
nitride;

the second layer (C2) is made of silicon-doped hafnium
oxide or made of HfZrO2.

15. A computer (CALC) for executing a computing algo-
rithm involving a plurality of numerical variables (w) in at
least two operating phases, the first operating phase (Ph1) essentially involving write
operations on the numerical variable;

the second operating phase (Ph2) essentially involving
read operations on the numerical variable;

said computer (CALC) comprising a data storage circuit
according to claim 1 for storing the numerical variables
(w) and wherein:

the memory cells (BC$_{ij}$) are configured by the control
means (CONT) to operate in the first configuration
(CONF1) during the execution of the first operating
phase;

the memory cells (BC$_{ij}$) are configured by the control
means (CONT) to operate in the second configura-
tion (CONF2) during the execution of the second
operating phase.

16. The computer (CALC) according to claim 15, con-
figured to implement an artificial neural network, the neural
network being formed of a succession of layers (C$_k$, C$_{k+1}$)
each consisting of a set of neurons, each layer being asso-
ciated with a set of synaptic coefficients (w$_{i,j}$); wherein:

the numerical variables are the synaptic coefficients of the
neural network, the first operating phase is a learning phase;

the second operating phase is an inference phase.

17. A method for controlling a storage circuit according to
claim 3 to drive the change from the first configuration
(CONF1) to the second configuration (CONF2), comprising
the following steps for each row of the matrix array of
memories:

i. selecting the row of the matrix array of memory cells via
the selection signal (VWL<i>);

ii. reading each memory cell and storing each row read
signal (x(fe)$_{ij}$) in the intermediate storage memories
(MEM_INT) so as to detect the direction of the elec-
trical polarization of each memory cell;

iii. applying, to each second input node (SL<j>) of said
row, a transformation voltage in order to form a con-
ductive filament in the second layer (C2) starting from
the third layer (C3) in each memory cell (BC$_{ij}$); said
filament corresponding to a high resistive state, iv. converting the read signals (x(fe)$_{ij}$) stored in the
intermediate storage memories (MEM_INT) during
operation in the first configuration (CONF1) to write
control signals compatible with the second configura-
tion (CONF2);

v. writing to the memory cells of said row in accordance
with the write control signals compatible with the
second configuration (CONF2) so as to vary the length
of the conductive filament that is formed.

* * * * *